United States Patent
Loewenthal et al.

(10) Patent No.: US 11,929,291 B2
(45) Date of Patent: *Mar. 12, 2024

(54) LAYER DETECTION FOR HIGH ASPECT RATIO ETCH CONTROL

(71) Applicant: NOVA LTD., Rehovot (IL)

(72) Inventors: Gil Loewenthal, Tel-Aviv (IL); Shay Yogev, Kibbutz Kfar Menachem (IL); Yoav Etzioni, Tel Aviv (IL)

(73) Assignee: NOVA LTD., Rehovot (IL)

( * ) Notice: Subject to any disclaimer, the term of this patent is extended or adjusted under 35 U.S.C. 154(b) by 123 days.

This patent is subject to a terminal disclaimer.

(21) Appl. No.: 17/445,727

(22) Filed: Aug. 23, 2021

(65) Prior Publication Data

US 2022/0044975 A1 Feb. 10, 2022

Related U.S. Application Data

(63) Continuation of application No. 16/349,287, filed as application No. PCT/IB2017/057158 on Nov. 16, 2017, now Pat. No. 11,107,738.

(60) Provisional application No. 62/422,885, filed on Nov. 16, 2016.

(51) Int. Cl.
| | |
|---|---|
| *H01L 21/66* | (2006.01) |
| *G01B 11/24* | (2006.01) |
| *G01N 21/95* | (2006.01) |
| *H01L 21/311* | (2006.01) |
| *H01L 21/67* | (2006.01) |
| *H10B 41/27* | (2023.01) |
| *H10B 43/27* | (2023.01) |

(52) U.S. Cl.
CPC ............. *H01L 22/26* (2013.01); *G01B 11/24* (2013.01); *G01N 21/9501* (2013.01); *H01L 21/31111* (2013.01); *H01L 21/67253* (2013.01); *G01B 2210/56* (2013.01); *H10B 41/27* (2023.02); *H10B 43/27* (2023.02)

(58) Field of Classification Search
CPC ............. H01L 21/26; H01L 21/31111; H01L 21/67253; G01B 11/24; G01N 21/9501; H01J 37/32972
See application file for complete search history.

(56) References Cited

U.S. PATENT DOCUMENTS

| | | |
|---|---|---|
| 4,208,240 A | 6/1980 | Latos |
| 4,611,919 A | 9/1986 | Brooks, Jr. et al. |
| 6,071,829 A | 6/2000 | Starck et al. |
| 6,449,038 B1 | 9/2002 | Stolze |

(Continued)

*Primary Examiner* — Binh X Tran
(74) *Attorney, Agent, or Firm* — Reches Patents

(57) ABSTRACT

Controlling an etch process applied to a multi-layered structure, by calculating a spectral derivative of reflectance of an illuminated region of interest of a multi-layered structure during an etch process applied to the multi-layered structure, identifying in the spectral derivative a discontinuity that indicates that an edge of a void formed by the etch process at the region of interest has crossed a layer boundary of the multi-layered structure, determining that the crossed layer boundary corresponds to a preselected layer boundary of the multi-layered structure, and applying a predefined control action to the etch process responsive to determining that the crossed layer boundary corresponds to the preselected layer boundary of the multi-layered structure.

9 Claims, 4 Drawing Sheets

(56) References Cited

U.S. PATENT DOCUMENTS

| | | | |
|---|---|---|---|
| 11,107,738 B2* | 8/2021 | Loewenthal | H01L 22/12 |
| 2004/0074867 A1* | 4/2004 | Han | H01L 21/76808 |
| | | | 216/2 |
| 2004/0084406 A1 | 5/2004 | Kamp et al. | |
| 2005/0006341 A1 | 1/2005 | Frum et al. | |
| 2006/0151430 A1 | 7/2006 | Yang et al. | |
| 2008/0078948 A1 | 4/2008 | Saito | |
| 2013/0130409 A1* | 5/2013 | Grimbergen | H01J 37/32972 |
| | | | 257/E21.528 |
| 2014/0038091 A1* | 2/2014 | Grimbergen | G03F 1/80 |
| | | | 430/5 |
| 2015/0226680 A1* | 8/2015 | Turovets | G01B 11/24 |
| | | | 356/237.5 |
| 2016/0099187 A1 | 4/2016 | Lian | |

* cited by examiner

LAYER DETECTION FOR HIGH ASPECT RATIO ETCH CONTROL

CROSS-REFERENCE TO RELATED APPLICATIONS

This application claims priority from U.S. Provisional Patent Application No. 62/422,885, filed Nov. 16, 2017, which is incorporated herein by reference.

BACKGROUND

A critical step in 3D-NAND manufacturing is the high aspect ratio etch through multiple layers of a film stack. Controlling the etch process is essential, such as when end point detection is employed to terminate the etch process so as to avoid underetch and overetch.

SUMMARY

In one aspect of the invention a method is provided for controlling an etch process applied to a multi-layered structure, the method including calculating a spectral derivative of reflectance of an illuminated region of interest of a multi-layered structure during an etch process applied to the multi-layered structure, identifying in the spectral derivative a discontinuity that indicates that an edge of a void formed by the etch process at the region of interest has crossed a layer boundary of the multi-layered structure, determining that the crossed layer boundary corresponds to a preselected layer boundary of the multi-layered structure, and applying a predefined control action to the etch process responsive to determining that the crossed layer boundary corresponds to the preselected layer boundary of the multi-layered structure.

In another aspect of the invention the multi-layered structure is a semiconductor.

In another aspect of the invention the void is either of a gate trench and a channel hole.

In another aspect of the invention the method further includes illuminating the region of interest of the multi-layered structure during the etch process applied to the multi-layered structure, and measuring the reflectance of the illuminated region of interest.

In another aspect of the invention the identifying includes identifying in the spectral derivative a plurality of discontinuities, where each of the discontinuities corresponds to a different layer boundary of the multi-layered structure.

In another aspect of the invention the method further includes determining, as any of the discontinuities in the spectral derivative are identified, a currently etched layer of the multi-layered structure based on a count of the discontinuities in the spectral derivative.

In another aspect of the invention the method further includes determining, as any of the discontinuities in the spectral derivative are identified, an etch rate based on an elapsed time between identifying any of the discontinuities in the spectral derivative.

In another aspect of the invention the applying includes effecting termination of the etch process.

In another aspect of the invention the effecting includes effecting termination of the etch process after a predefined delay.

In another aspect of the invention the predefined delay is based on an etch rate of a currently etched layer of the multi-layered structure.

In another aspect of the invention a system is provided for controlling an etch process applied to a multi-layered structure, the system including an etch layer detector configured to calculate a spectral derivative of reflectance of an illuminated region of interest of a multi-layered structure during an etch process applied to the multi-layered structure, and identify in the spectral derivative a discontinuity that indicates that an edge of a void formed by the etch process at the region of interest has crossed a layer boundary of the multi-layered structure, and an etch process controller configured to determine that the crossed layer boundary corresponds to a preselected layer boundary of the multi-layered structure, and apply a predefined control action to the etch process responsive to determining that the crossed layer boundary corresponds to the preselected layer boundary of the multi-layered structure.

In another aspect of the invention the multi-layered structure is a semiconductor.

In another aspect of the invention the void is either of a gate trench and a channel hole.

In another aspect of the invention the system further includes an optical profile monitor configured to illuminate the region of interest of the multi-layered structure during the etch process applied to the multi-layered structure, and measure the reflectance of the illuminated region of interest.

In another aspect of the invention the etch layer detector is configured to identify in the spectral derivative a plurality of discontinuities, where each of the discontinuities corresponds to a different layer boundary of the multi-layered structure.

In another aspect of the invention the etch layer detector is configured to determine, as any of the discontinuities in the spectral derivative are identified, a currently etched layer of the multi-layered structure based on a count of the discontinuities in the spectral derivative.

In another aspect of the invention the etch layer detector is configured to determine, as any of the discontinuities in the spectral derivative are identified, an etch rate based on an elapsed time between identifying any of the discontinuities in the spectral derivative.

In another aspect of the invention the etch process controller is configured to apply the predefined control action by effecting termination of the etch process.

In another aspect of the invention the etch process controller is configured to effect termination of the etch process after a predefined delay.

In another aspect of the invention the predefined delay is based on an etch rate of a currently etched layer of the multi-layered structure.

BRIEF DESCRIPTION OF THE DRAWINGS

Aspects of the invention will be understood and appreciated more fully from the following detailed description taken in conjunction with the appended drawings in which.

DETAILED DESCRIPTION

Figure 1:
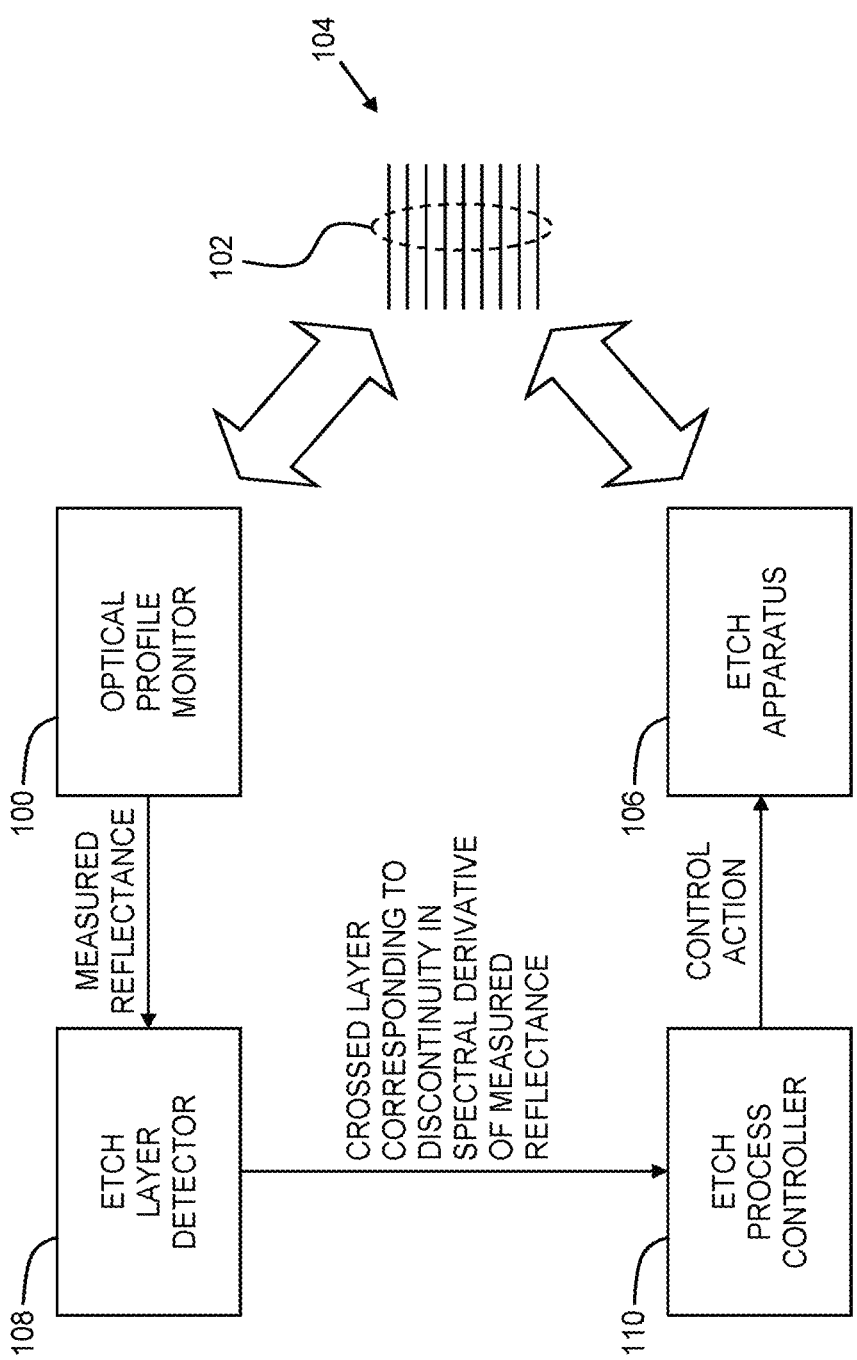
FIG. 1 is a simplified conceptual illustration of a system for controlling an etch process applied to a multi-layered structure, constructed and operative in accordance with an embodiment of the invention.

Reference is now made to FIG. 1, which is a simplified conceptual illustration of a system for controlling an etch process applied to a multi-layered structure, constructed and operative in accordance with an embodiment of the invention. In the system of FIG. 1, an optical profile monitor 100 is configured in accordance with conventional techniques to monitor a region of interest 102 of a multi-layered structure 104 during an etch process that is applied in accordance with conventional techniques to multi-layered structure 104, such as by etch apparatus 106. Multi-layered structure 104 may, for example, be a semiconductor wafer that is being etched to form 3D-NAND flash memory in accordance with conventional techniques, where multi-layered structure 104 includes a film stack of Oxide-Nitride or Oxide-Poly layers deposited on a base substrate, as well as a masking layer. Optical profile monitor 100 is configured to illuminate region of interest 102 during the etch process, and particularly during high aspect ratio etch where voids, such as gate trenches and channel holes, are etched into multi-layered structure 104 at region of interest 102. Optical profile monitor 100 is configured to illuminate region of interest 102 and measure the reflectance of the illuminated region in accordance with conventional techniques, such as are described in U.S. Pat. No. 9,528,946.

Figure 2A:
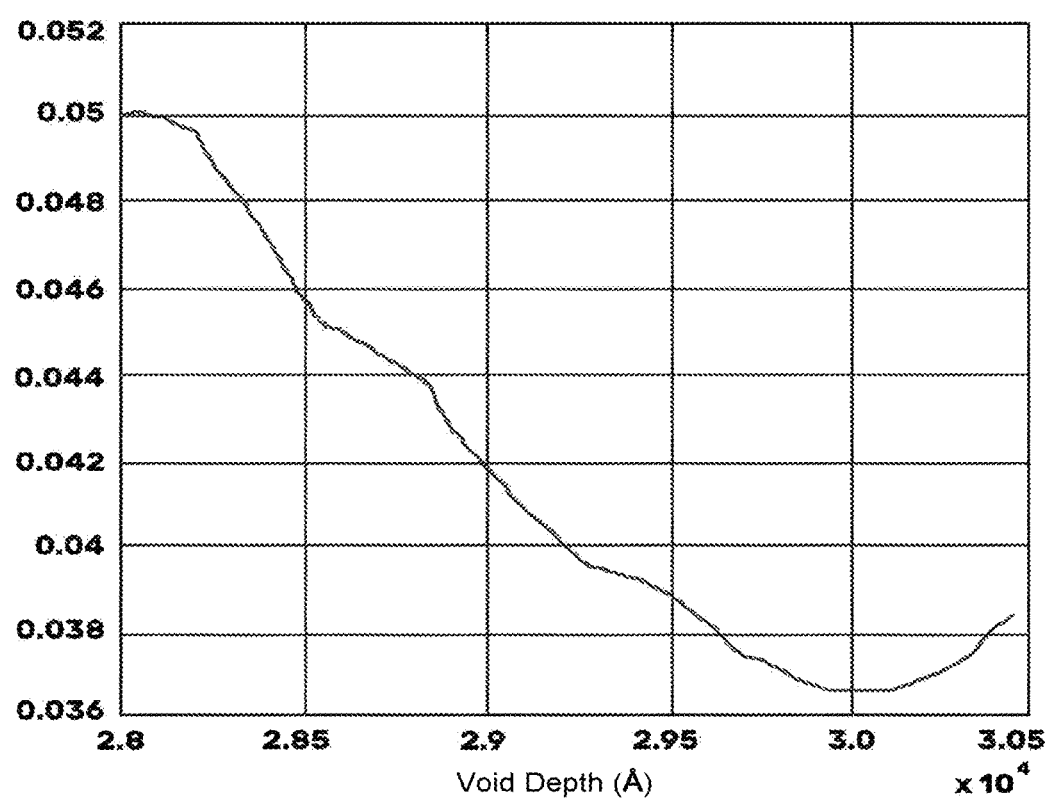
FIG. 2A is exemplary graph of measured reflectance, useful in understanding the invention.

An exemplary graph of measured reflectance as described hereinabove is shown in FIG. 2A, where reflectance is shown as a function of void depth which is used as a proxy for etch time, and where void depth is determined in accordance with conventional techniques.

An etch layer detector 108 is configured to calculate a spectral derivative of the reflectance of region of interest 102 as measured by optical profile monitor 100. Etch layer detector 108 is configured to calculate the spectral derivative of the reflectance of region of interest 102 at different points in time throughout the etch process. In one embodiment, at each of the different points in time the spectral derivative calculation is of the entire spectrum of the reflected light. Additionally or alternatively, at each of the different points in time a different spectral derivative calculation is made at each of a number of different wavelengths of the reflected light, where any of these measurements or combinations of any of these measurements, such as an average thereof, are used as described hereinbelow.

Etch layer detector 108 is configured to identify discontinuities in the spectral derivative, where a discontinuity that indicates that an edge of one or more voids formed by the etch process at region of interest 102 has crossed a layer boundary one of the layers of multi-layered structure 104. Etch layer detector 108 is configured to identify a series of such discontinuities in the spectral derivative, where each of the discontinuities corresponds to a different layer boundary of multi-layered structure 104.

Figure 2B:
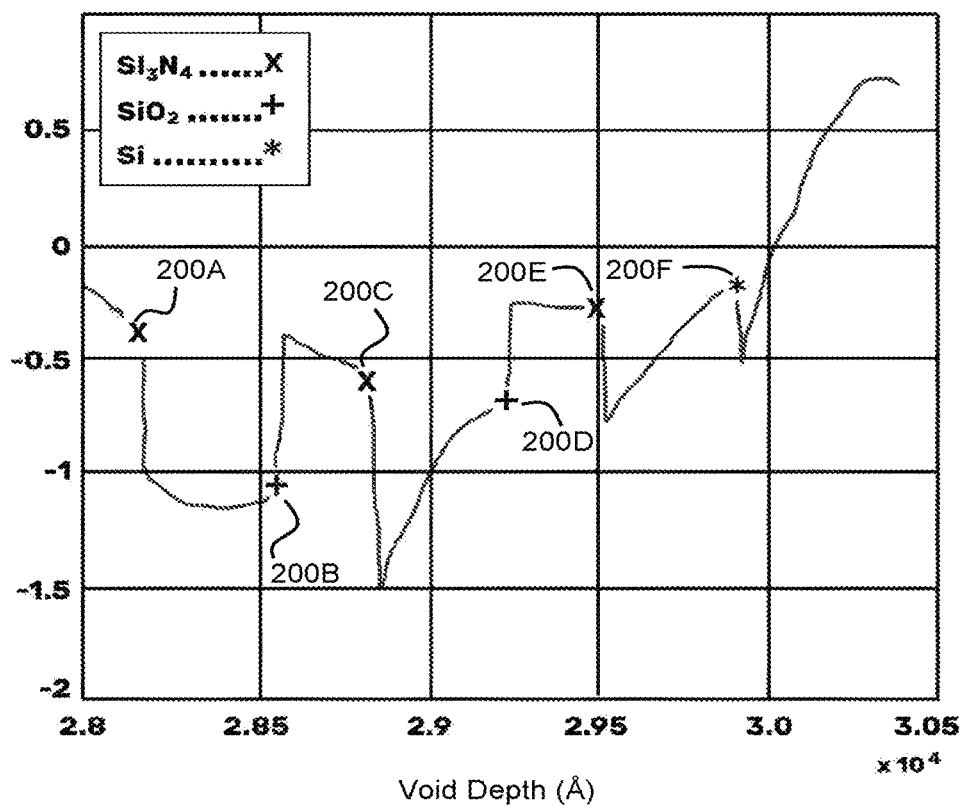
FIG. 2B is exemplary graph of the spectral derivative of measured reflectance, useful in understanding the invention.

An exemplary graph of the spectral derivative of measured reflectance as described hereinabove is shown in FIG. 2B, where the spectral derivative of measured reflectance is also shown as a function of void depth. In FIG. 2B six consecutive discontinuities in the spectral derivative are shown at 200A, 200B, 200C, 200D, 200E, and 200F. Where the number, order, and chemical composition of the layers are known, each discontinuity may be identified as corresponding to a specific layer and its known chemical composition as shown in FIG. 2B.

Etch layer detector 108 is configured to determine, as any of the discontinuities in the spectral derivative are identified, a currently etched layer of multi-layered structure 104 based on a count of the discontinuities in the spectral derivative. Thus, for example, where the reflectance of region of interest 102 is measured from the start of the etch process and made available to etch layer detector 108, and up to a given point in time during the etch process etch layer detector 108 has identified three discontinuities in the spectral derivative, etch layer detector 108 determines that the fourth layer of multi-layered structure 104 is the currently etched layer.

In one embodiment, etch layer detector 108 is configured to determine, as any of the discontinuities in the spectral derivative are identified, a current etch rate up to a given point in time during the etch process based on the elapsed time between identifying any, and preferably all, of the discontinuities in the spectral derivative up to that point.

An etch process controller 110 is configured to determine that a crossed layer boundary as detected by etch layer detector 108 corresponds to a preselected layer boundary of multi-layered structure 104, and apply a predefined control action to the etch process responsive to determining that the crossed layer boundary corresponds to the preselected layer boundary of multi-layered structure 104. Thus, for example, if the number of layers in multi-layered structure 104 is known prior to the start of the etch process, such as 48 layers, there are thus 48 layer boundaries not counting the top of the first layer. In this example the $48^{th}$ layer boundary, being the bottom-most layer boundary, may be preselected such that when etch process controller 110 determines that a crossed layer boundary as detected by etch layer detector 108 corresponds to the $48^{th}$ layer boundary, etch process controller 110 applies a predefined control action to the etch process, such as by causing etch apparatus 106 to terminate the etch process in accordance with conventional techniques. Alternatively, the $47^{th}$ layer boundary may be preselected, and when etch process controller 110 determines that a crossed layer boundary as detected by etch layer detector 108 corresponds to the $47^{th}$ layer boundary, etch process controller 110 applies a predefined control action to the etch process after a predefined delay. The predefined delay may be based on the etch rate of the currently etched layer of multi-layered structure 104, i.e., the $48^{th}$ layer, such as by using the etch rate to estimate the time needed to complete etching the currently etched layer and setting the delay equal to this amount of time. Additionally or alternatively, the predefined delay may be based on historical etch rates for layers of the same or similar chemical composition and geometry.

Figure 3:
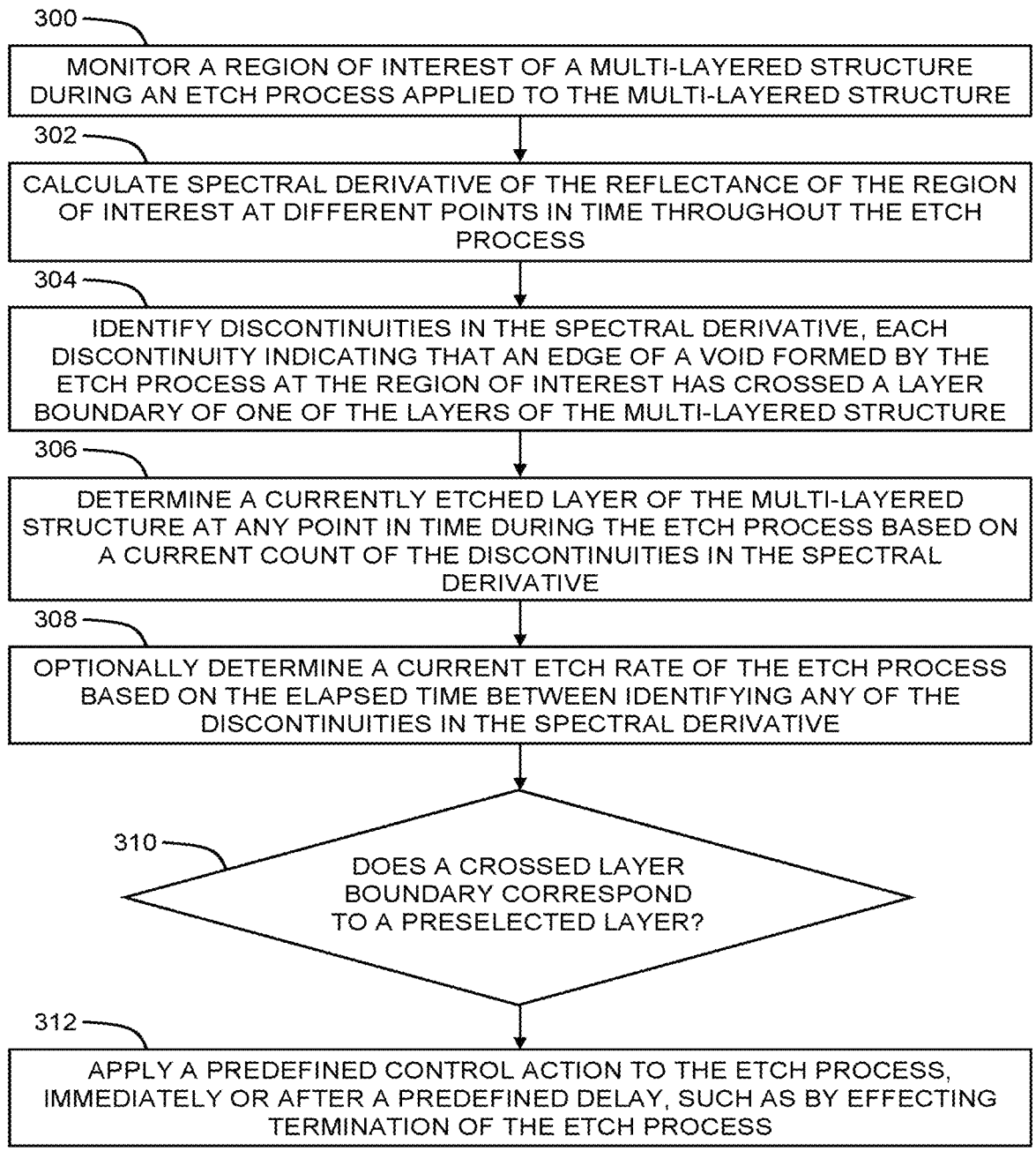
FIG. 3 is a simplified flowchart illustration of an exemplary method of operation of the system of FIG. 1, operative in accordance with an embodiment of the invention.

Reference is now made to FIG. 3, which is a simplified flowchart illustration of an exemplary method of operation of the system of FIG. 1, operative in accordance with an embodiment of the invention. In the method of FIG. 3, a region of interest of a multi-layered structure is monitored during an etch process that is applied to the multi-layered structure (step 300). A spectral derivative of the reflectance of the region of interest is calculated at different points in time throughout the etch process (step 302). Discontinuities in the spectral derivative are identified, each discontinuity indicating that an edge of one or more voids formed by the etch process at the region of interest has crossed a layer boundary of one of the layers of the multi-layered structure (step 304). A currently etched layer of the multi-layered structure is determined at any point in time during the etch process based on a current count of the discontinuities in the spectral derivative (step 306). Optionally, a current etch rate of the etch process is determined based on the elapsed time between identifying any of the discontinuities in the spectral derivative (step 308). If a crossed layer boundary corresponds to a preselected layer boundary (step 310), a predefined control action is applied to the etch process, immediately or after a predefined delay, such as by effecting termination of the etch process (step 312).

The flowchart and block diagrams in the drawing figures illustrate the architecture, functionality, and operation of possible implementations of systems, methods, and computer program products according to various embodiments of the invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the drawing figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A metrology system for controlling an etch process applied by an etch apparatus to a multi-layered structure, the metrology system comprises:
   an optical profile monitor that is configured to (a) illuminate a region of interest of the multi-layered structure during an etch process applied to the multi-layered structure; and (b) measure a spectral reflectance of the region of interest of the multi-layered structure;
   an etch layer detector that is configured to (a) calculate a spectral derivative of a spectral reflectance signal obtained from the measuring; (b) identify, in the spectral derivative, a discontinuity indicative of a of crossing a layer boundary of the multi-layered structure; and
   a controller that is configured to (a) determine that the layer boundary corresponds to a preselected layer boundary of the multi-layered structure; and (b) generate control signals for applying a predefined control action to the etch process responsive to determining that the crossed layer boundary corresponds to the preselected layer boundary of the multi-layered structure.

2. The metrology system according to claim 1 wherein the control signals are for effecting termination of the etch process.

3. The metrology system according to claim 1 wherein the edge layer detector is configured to calculate the spectral derivatives at each of multiple different wavelengths of the reflectance.

4. The metrology system according to claim 3 wherein the edge layer detector is configured to calculate an average of the spectral derivatives at each of multiple different wavelengths of the reflectance.

5. The metrology system according to claim 1 wherein the control signals are for effecting termination of the etch process after a predefined delay.

6. The metrology system according to claim 5 wherein the predefined delay is based on an etch rate of a currently etched layer of the multi-layered structure.

7. The metrology system according to claim 1 wherein the etch layer detector is configured to identify in the spectral derivative a plurality of discontinuities, wherein each of the discontinuities corresponds to a different layer boundary of the multi-layered structure.

8. The metrology system according to claim 7 wherein the etch layer detector is configured to determine, as any of the discontinuities in the spectral derivative are identified, a currently etched layer of the multi-layered structure based on a count of the discontinuities in the spectral derivative.

9. The metrology system according to claim 8 wherein the etch layer detector is configured to determine, as any of the discontinuities in the spectral derivative are identified, an etch rate based on an elapsed time between identifying any of the discontinuities in the spectral derivative.

* * * * *